(12) United States Patent
Tang et al.

(10) Patent No.: US 12,243,745 B2
(45) Date of Patent: Mar. 4, 2025

(54) DYNAMIC LASER-ASSISTED ETCHING

(71) Applicant: Taiwan Semiconductor Manufacturing Co., Ltd., Hsinchu (TW)

(72) Inventors: Han-Yu Tang, Hsinchu (TW); Ming-Hua Yu, Hsinchu (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 374 days.

(21) Appl. No.: 17/656,921

(22) Filed: Mar. 29, 2022

(65) Prior Publication Data

US 2023/0253207 A1    Aug. 10, 2023

Related U.S. Application Data

(60) Provisional application No. 63/267,620, filed on Feb. 7, 2022.

(51) Int. Cl.
| | |
|---|---|
| *H01L 21/02* | (2006.01) |
| *B23K 26/06* | (2014.01) |
| *B23K 26/08* | (2014.01) |
| *B23K 26/362* | (2014.01) |
| *B23K 26/402* | (2014.01) |

(Continued)

(52) U.S. Cl.
CPC ...... *H01L 21/2633* (2013.01); *B23K 26/0608* (2013.01); *B23K 26/0665* (2013.01); *B23K 26/0823* (2013.01); *B23K 26/362* (2013.01); *B23K 26/402* (2013.01);

(Continued)

(58) Field of Classification Search
CPC ............... H01L 21/2633; H01L 21/263; H01L 21/0262; H01L 21/02; H01L 21/268; H01L 21/3065; H01L 21/67069; H01L 21/67; H01L 21/67115; H01L 29/165; H01L 29/267; H01L 29/66545; H01L 29/66; H01L 29/6656; H01L 29/263; H01L 29/66636; B23K 26/0608; B23K 26/06; B23K 26/0665; B23K 26/0823; B23K 26/08; B23K 26/362; B23K 26/402; B23K 26/034; B23K 26/03; B23K 26/064; B23K 26/60; B23K 2101/40; B23K 2103/56; B23K 2103/00; B23K 26/0613; B23K 26/0619; B23K 103/00; G02B 27/0955; G02B 27/09; G02B 27/30; G02B 27/0927; G02B 3/00
See application file for complete search history.

(56) References Cited

U.S. PATENT DOCUMENTS

| | | |
|---|---|---|
| 5,795,493 A | 8/1998 | Bukhman et al. |
| 7,112,763 B2 | 9/2006 | Hunter et al. |

(Continued)

FOREIGN PATENT DOCUMENTS

| | | |
|---|---|---|
| DE | 102020213011 A1 | 4/2021 |
| JP | 2002252212 A | 9/2002 |

(Continued)

*Primary Examiner* — Nikolay K Yushin
(74) *Attorney, Agent, or Firm* — Slater Matsil, LLP

(57) ABSTRACT

A method includes forming a plurality of semiconductor regions on a wafer, placing the wafer in an etching chamber, globally heating the wafer using a heating source, and projecting a laser beam on the wafer. When the wafer is heated by both of the heating source and the laser beam, the plurality of semiconductor regions on the wafer are etched.

20 Claims, 14 Drawing Sheets

(51) Int. Cl.
   *G02B 27/09* (2006.01)
   *H01L 21/263* (2006.01)
   *B23K 103/00* (2006.01)
(52) U.S. Cl.
   CPC ...... *G02B 27/0955* (2013.01); *H01L 21/0262* (2013.01); *B23K 2103/56* (2018.08)

(56) References Cited

U.S. PATENT DOCUMENTS

| | | |
|---|---|---|
| 9,700,959 B2 | 7/2017 | Venturini et al. |
| 10,741,457 B2 | 8/2020 | Aderhold et al. |
| 2002/0182877 A1 | 12/2002 | Nantel et al. |
| 2005/0250292 A1 | 11/2005 | Baluswamy et al. |
| 2010/0301026 A1 | 12/2010 | Oishi et al. |
| 2017/0098539 A1 | 4/2017 | Shatalov et al. |
| 2017/0271131 A1 | 9/2017 | Moffatt et al. |
| 2021/0118755 A1 | 4/2021 | Nomaru |
| 2021/0197314 A1 | 7/2021 | Swoboda et al. |

FOREIGN PATENT DOCUMENTS

| | | |
|---|---|---|
| KR | 100885098 B1 | 2/2009 |
| KR | 20110004458 A | 1/2011 |
| KR | 20120004514 A | 1/2012 |
| TW | 201933453 A | 8/2019 |

DYNAMIC LASER-ASSISTED ETCHING

PRIORITY CLAIM AND CROSS-REFERENCE

This application claims the benefit of the following provisionally filed U.S. Patent application: Application No. 63/267,620, filed on Feb. 7, 2022, and entitled "Dynamic Laser-Assisted Etching (DLE) in Epitaxy Chamber," which application is hereby incorporated herein by reference.

BACKGROUND

The manufacturing of integrated circuits comprises multiple process steps, including epitaxy and etching of semiconductor regions. The epitaxy and etching processes are generally performed at wafer level, and the epitaxy and the etching processes are performed on an entire wafer. The wafer may include a plurality of chips therein, which are later sawed into discrete dies. To maintain the yield of the manufacturing process, the uniformity of the epitaxy and the etching processes throughout the wafer needs to be maintained.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
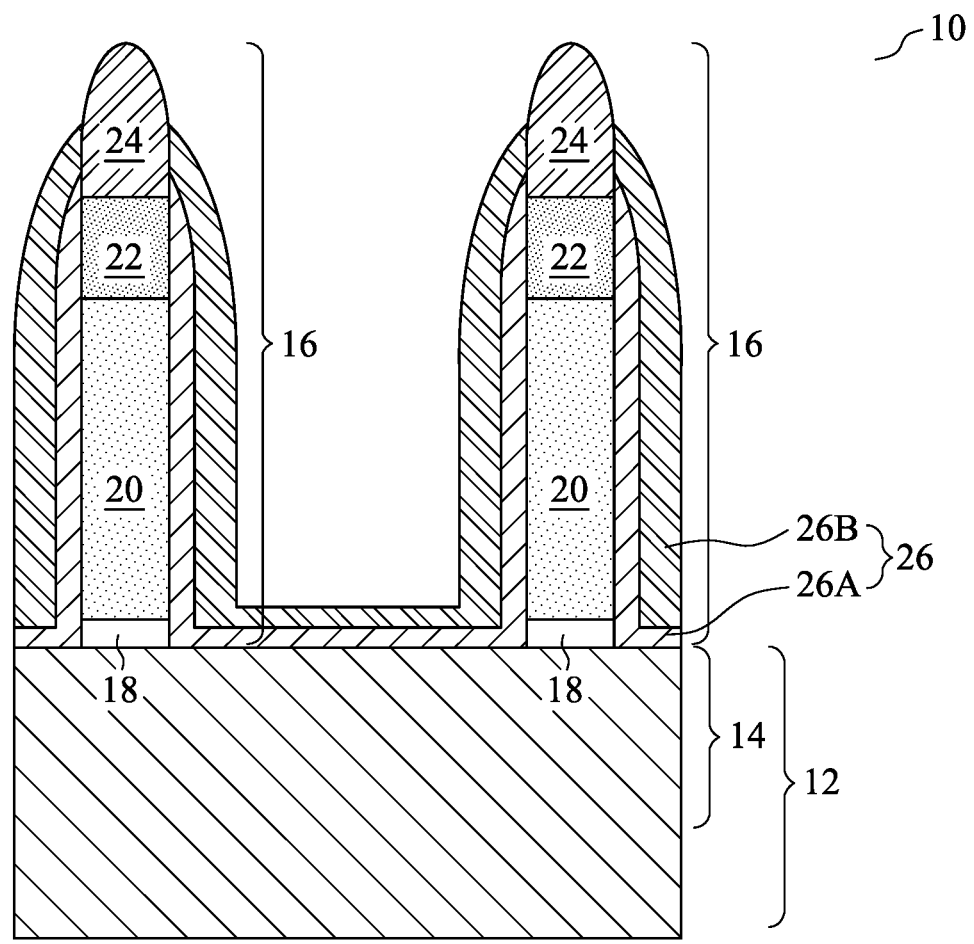
FIGS. 1-6 illustrate intermediate stages in the formation of a transistor including a laser-assisted etch-back process in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Transistor formation processes including a laser-assisted etch-back process and the corresponding apparatus for performing the same are provided. In accordance with some embodiments, epitaxy regions are formed on a wafer. Due to the non-uniformity in the epitaxy process, the epitaxy regions in different parts of the wafer may have different thicknesses. An etching process may be performed to reduce or eliminate the non-uniformity. In accordance with some embodiments, a laser beam(s) is provided to selectively heat selected regions on the wafer during the etching process. The laser beam may be fixed to heat certain parts of the wafer, or may be moved to project different positions of the wafer. The power, the spot size, the incident angle, etc. of the laser beam(s) may be adjusted, depending on the required heating at the selected locations. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

Figure 19:
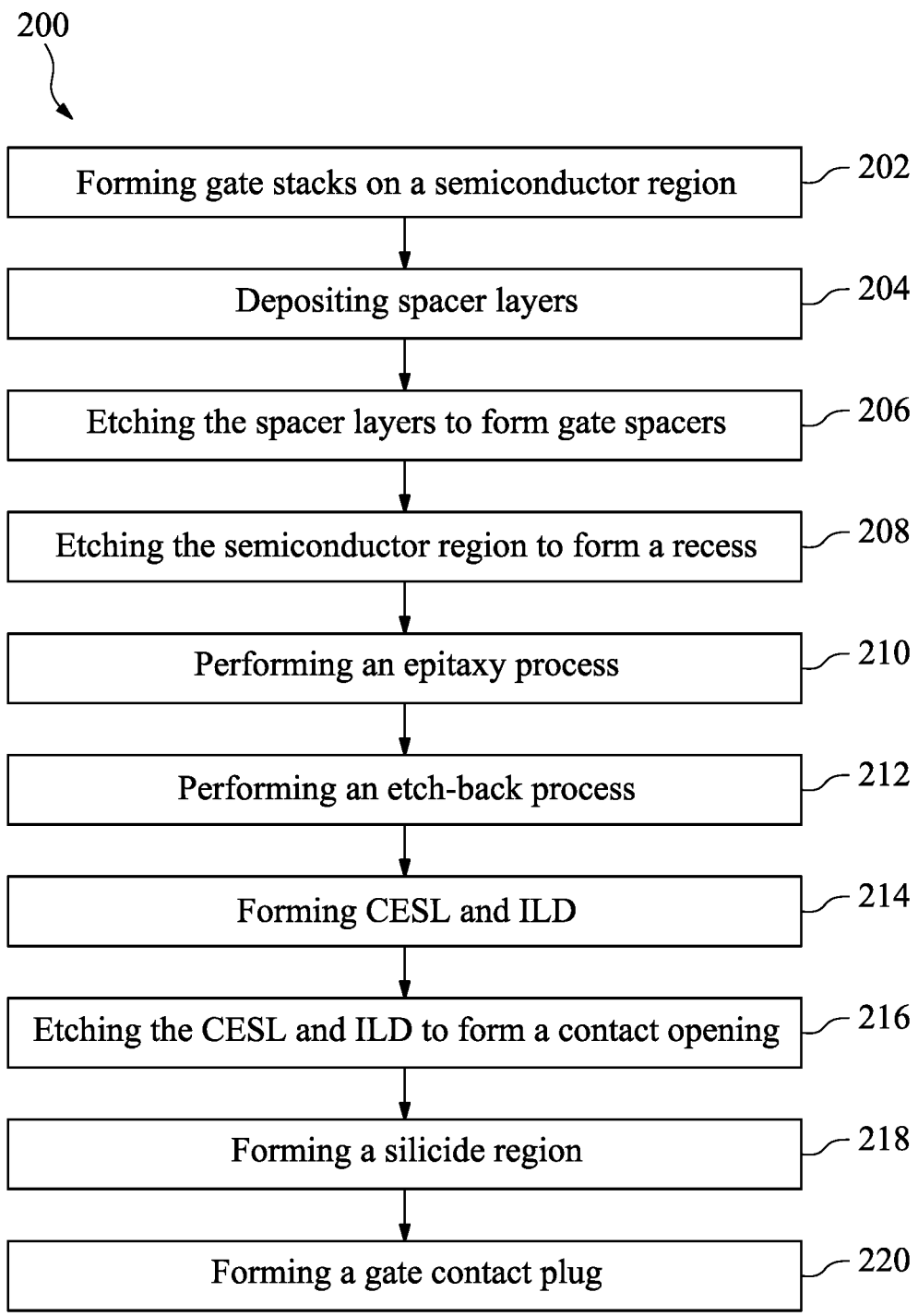
FIG. 19 illustrates a process flow for forming a transistor including a laser-assisted etching process in accordance with some embodiments.

FIGS. 1 through 6 illustrate the cross-sectional views of intermediate stages in the formation of transistors in accordance with some embodiments of the present disclosure. The corresponding processes are also reflected schematically in the process flow shown in FIG. 19.

FIG. 1 illustrates a cross-section view of wafer 10. In accordance with some embodiments, wafer 10 includes semiconductor substrate 12, which may comprise a silicon substrate, a silicon germanium substrate, a germanium substrate, or the like. Wafer 10 may include a plurality of different features formed of different materials, which features may include, and are not limited to, Shallow Trench Isolation (STI) regions, well regions, or the like.

In accordance with some embodiments, wafer 10 includes a plurality of semiconductor regions 14, with one of semiconductor regions 14 being illustrated. Semiconductor region 14 may be a protruding semiconductor fin, which protrudes higher than neighboring STI regions (not in the illustrated plane), which may define the boundaries of the semiconductor region 14.

Gate stacks 16 may be formed on the top surfaces and the sidewalls of semiconductor region 14. The respective process is illustrated as process 202 in the process flow 200 shown in FIG. 19. In accordance with some embodiments, gate stacks 16 are dummy gate stacks, and hence are referred to as dummy gate stacks 16 hereinafter. In accordance with alternative embodiments, gate stacks 16 are actually gate stacks in the final structure. Dummy gate stacks 16 may include dummy gate dielectrics 18 and dummy gate electrodes 20 over dummy gate dielectrics 18. Dummy gate dielectrics 18 may be formed by oxidizing the surface portions of protruding fins 14 to form oxide layers, or by depositing a dielectric layer such as a silicon oxide layer. Dummy gate electrodes 20 may be formed, for example, using polysilicon or amorphous silicon, and other materials such as amorphous carbon may also be used. Each of dummy gate stacks 16 may also include hard masks 22 and 24 over the respective dummy gate electrode 20. Hard masks 22 and 24 may be formed of silicon nitride, silicon oxide, silicon carbo-nitride, silicon oxy-carbo nitride, or multilayers thereof. The formation of dummy gate stacks 16 may include forming a dummy gate dielectric layer, depositing a dummy gate electrode layer over the dummy gate dielectric layer, depositing one or more hard mask layers, and then patterning the formed layers through a patterning process(es).

Spacer layers 26A and 26B, which are collectively referred to as spacer layers 26, are deposited. The respective process is illustrated as process 204 in the process flow 200 shown in FIG. 19. In accordance with some embodiments of the present disclosure, spacer layers 26 are formed of dielectric materials selected from silicon nitride (SiN), silicon oxide ($SiO_2$), silicon carbo-nitride (SiCN), silicon oxynitride (SiON), silicon oxy-carbo-nitride (SiOCN), and the like. Spacer layers 26 may have a multi-layer structure, as illustrated, and may include two, three, or more sub layers that comprise different materials. Alternatively, a single spacer layer 26 may be adopted. The formation process may include a conformal deposition process(es), so that spacer layers 26A and 26B are conformal, for example, with different parts of each of the spacer layers 26A and 26B having a thickness variation smaller than about 20 percent, or smaller than about 10 percent. The formation process may include ALD, CVD, or the like.

Figure 2:
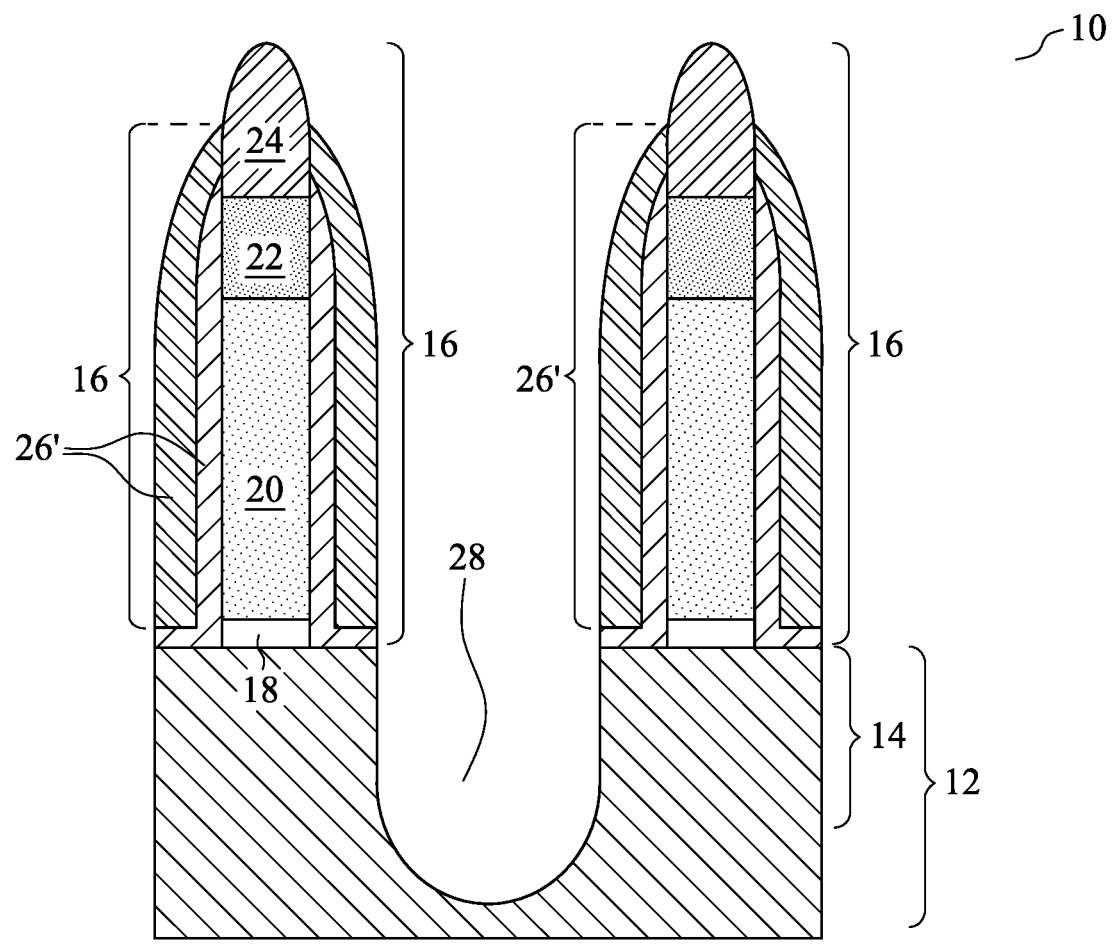

Referring to FIG. 2, anisotropic etching processes are performed. The horizontal portions of spacer layers 26 are removed, exposing the underlying portions of semiconductor region 14. The respective process is illustrated as process 206 in the process flow 200 shown in FIG. 19. The vertical portions of spacer layers 26 are left as gate spacers 26'. The etching process may be performed using etching gases such as the mixture of $NF_3$ and $NH_3$, the mixture of HF and $NH_3$, and/or a fluorine-containing gas such as $CF_4$, $NF_3$ $SF_6$, $CHF_3$, or combinations thereof.

Next, a portion of semiconductor region 14 that is laterally offset from dummy gate stacks 16 and gate spacers 26' are vertically recessed through an etching process to form recess 28. The respective process is illustrated as process 208 in the process flow 200 shown in FIG. 19. For example, a dry etch process may be performed using $C_2F_6$, $CF_4$, $SO_2$, the mixture of HBr, $Cl_2$, and $O_2$, the mixture of HBr, $Cl_2$, $O_2$, and $CH_2F_2$, or the like to etch semiconductor region 14. In accordance with some embodiments in which semiconductor region 14 comprises a protruding semiconductor fin, the bottom of recess 28 may be level with or lower than the bottom of the protruding semiconductor fin to extend into the underlying bulk portion of semiconductor substrate 12. The etching may be anisotropic, so that some sidewalls of semiconductor region 14 facing recess 28 are vertical and straight.

Figure 3:
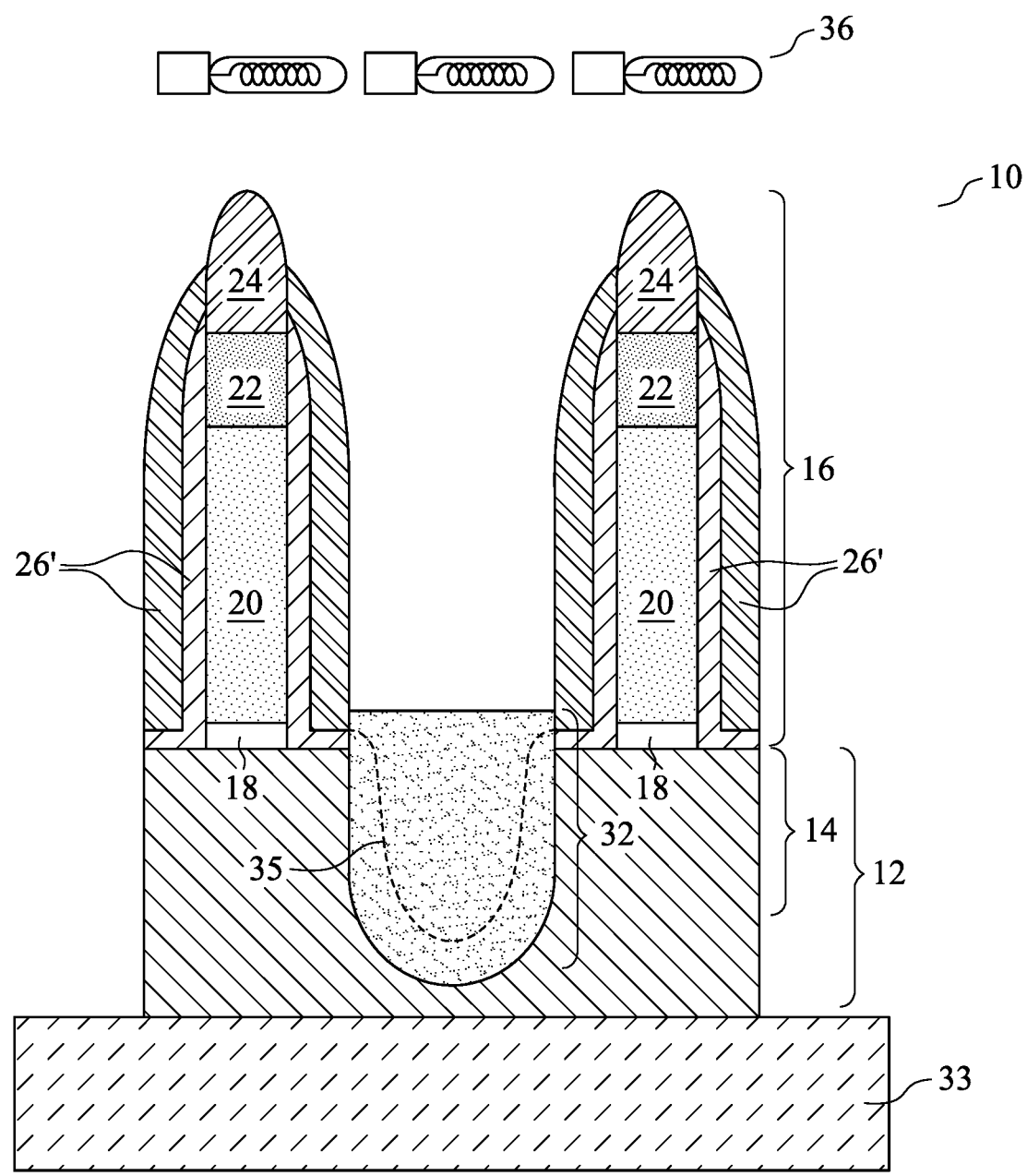

FIG. 3 schematically illustrates the epitaxy of semiconductor region 32. The respective process is illustrated as process 210 in the process flow 200 shown in FIG. 19. It is appreciated that although one semiconductor region 32 is shown, there are a plurality of semiconductor regions 32 simultaneously grown throughout wafer 10. Accordingly, throughout the description, either singular form or plural form may be used when referring to semiconductor region(s) 32. The epitaxy process may be performed in a vacuum chamber, and wafer 10 is placed on a susceptor (such as an E-Chuck) 33.

Semiconductor regions 32 may be or may comprise silicon, germanium, silicon germanium, gallium arsenide (GaAs), indium gallium arsenide ($In_xG_{1-x}As$), indium aluminium arsenide ($In_xAl_{1-x}As$), indium phosphide (InP), indium antimonide (InSb), indium gallium antimonide ($In_xGa_{1-x}Sb$), gallium antimonide (GaSb), or the like, or combinations thereof. In accordance with some embodiments, semiconductor regions 32 are selectively grown from semiconductor materials such as the exposed surface of semiconductor region 14, but not from the exposed dielectric regions such as STI regions, gate spacers 26', hard masks 24, or the like. The selective growth may be achieved, for example, by introducing etching gases such as HCl, $Cl_2$, and/or the like.

In accordance with some embodiments, the epitaxial growth is performed using Chemical Vapor Deposition (CVD), Atomic Layer Deposition (ALD), Reduced Pressure Chemical Vapor Deposition (RPCVD), Plasma Enhanced Chemical Vapor Deposition (PECVD), or the like. Semiconductor regions 32 may be the source/drain regions for forming n-type or p-type transistors, and hence may alternatively referred to as source/drain regions 32. The source/drain regions 32 of n-type transistors may be doped with an n-type dopant such as phosphorus, arsenic, antimony, or the like, or combinations thereof. The source/drain regions 32 of p-type transistors may be doped with a p-type impurity, such as boron, indium, gallium, or the like, or combinations thereof.

During the epitaxy process, heat source 36 may be used to heat wafer 10 globally. In accordance with some embodiments, heat source 36 comprises a lamp or a plurality of lamps (such as halogen-based lamps), which may project light in the visible spectrum or broad-spectrum light ranging from infra-red (IR) to ultra-violet (UV). Heat source 36 may also comprise multiple zones, such as an outer zone and an inner zone with separate controls. In accordance with alternative embodiments, wafer 10 is heated from under, and the susceptor 33 may be heated to heat wafer 10. The heating of the susceptor may also be bottom lamp-based heating, which can also comprise multiple zones. In accordance with yet alternative embodiments, both of heat source 36 and the heated susceptor 33 are adopted.

In accordance with some embodiments, there may be wafer-level non-uniformity in the growth rate of semiconductor regions 32 throughout wafer 10. Accordingly, some parts of wafer 10 may have the corresponding growth rates of semiconductor regions 32 being higher than the growth rates of semiconductor regions 32 in other parts of wafer 10. The wafer-level non-uniformity may be caused by the non-uniformity in the heating of wafer 10 during the epitaxy process, and/or other factors such as the non-uniformity in the flow of precursors.

Figure 7:
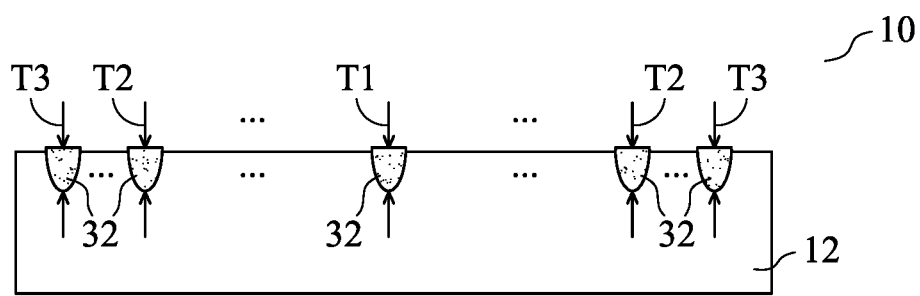
FIG. 7 illustrates a cross-sectional view of a wafer with non-uniformity in the thicknesses of semiconductor regions in accordance with some embodiments.

FIG. 7 schematically illustrates the cross-sectional view of wafer 10, wherein some example semiconductor regions 32 are illustrated. Other features in wafer 10 such as the dummy gate stacks 16 and gate spacers 26' as shown in FIG. 3 are not shown in FIG. 7, while these features also exist as parts of wafer 10.

Due to the non-uniformity in the epitaxy process, as shown in FIG. 7, different epitaxy regions 32 may have different thicknesses, as illustrated as thickness T1, T2, and T3 as examples. For example, at the wafer center, the thickness T1 of the corresponding epitaxy regions 32 may be greater than thickness T2 and T3, wherein thickness T3 is the thickness of a semiconductor region 32 close to the edge of wafer 10, while thickness T2 is the thickness of a semiconductor region 32 in a region between the center and the edge of wafer 10. In the regions between the center and the edge of wafer 10, semiconductor regions 32 have thickness T2.

Depending on the material, the epitaxy process, etc., there may be different types of non-uniformity. For example, the thickness T2 in some regions may be greater than thickness T1 and/or thickness T3. Also, when traversing from the center to the edge of wafer 10 along a diameter of wafer 10, the thicknesses of the corresponding semiconductor regions 32 may gradually increase or reduce, until at some point, the thickness starts to reduce or increase again.

Figure 4:
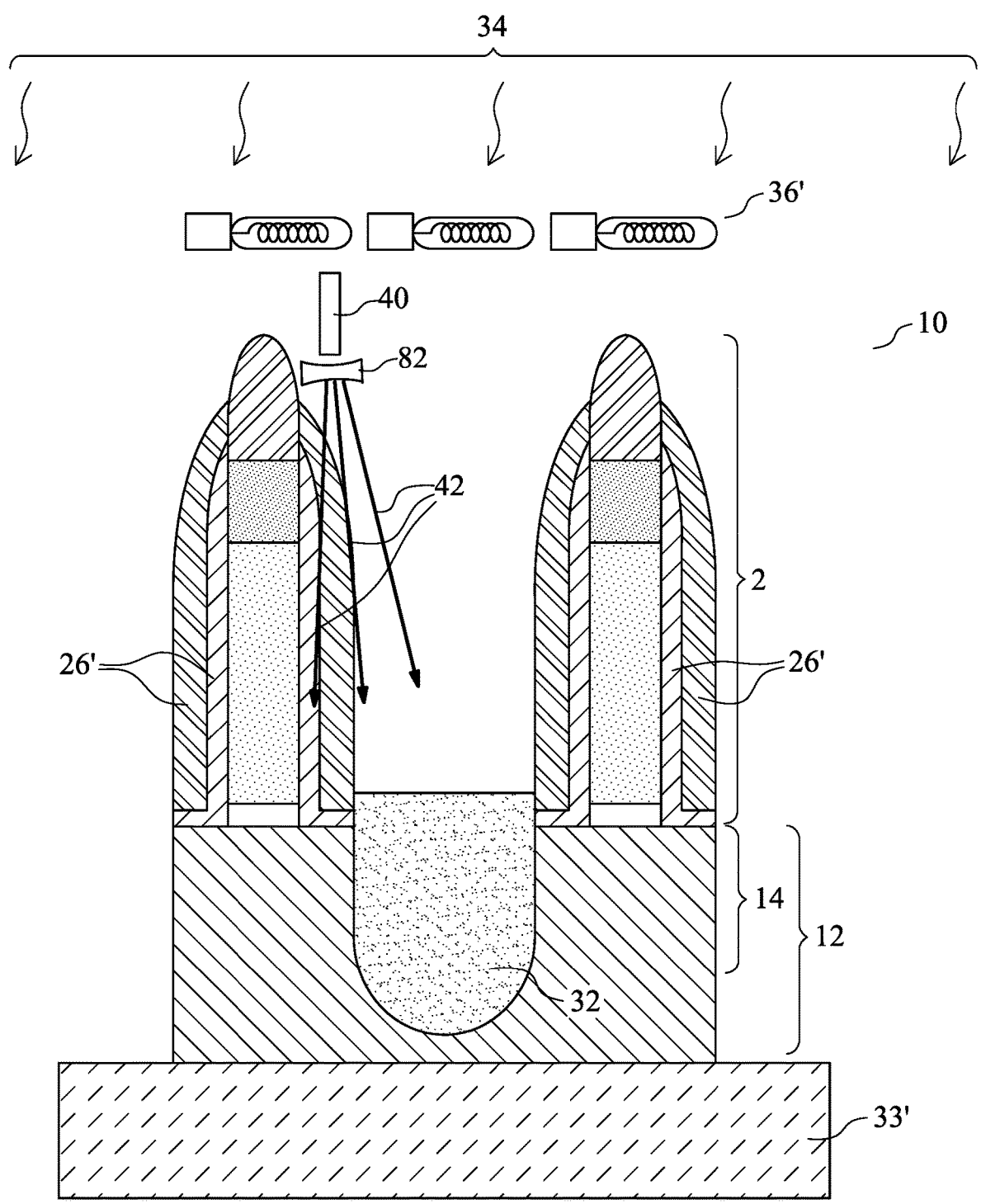

Referring to FIG. 4, an etch-back process 34 is performed on wafer 10. The respective process is illustrated as process 212 in the process flow 200 shown in FIG. 19. During the etch-back process, semiconductor regions 32 are selectively etched and recessed, but are not fully removed. The etch-back process has the function of etching back some of semiconductor regions 32 more or less than other semiconductor regions 32, so that the through-wafer-uniformity in the thicknesses of wafer 10 is improved. Also, the etch-back process may be performed to remove any semiconductor material that is unintentionally deposited on dielectric regions such as on the sidewalls of gate spacers 26' and hard masks 24.

In accordance with some embodiments, the etch-back process 34 is performed after the epitaxy process is finished, and the top surfaces of semiconductor regions 32 are higher than the top surfaces of semiconductor region 14, as shown in FIG. 4. In accordance with alternative embodiments, the etch-back may be performed before the epitaxy process is finished. For example, FIG. 3 illustrates dashed line 35 representing the surface of semiconductor region 32 when the etch-back process is performed. After the etch-back process performed on surface 35, the epitaxy may be continued. There may be one or a plurality of epitaxy and etched-back cycles.

In accordance with some embodiments, the etch-back process is in-situ performed with the preceding epitaxy process in a same vacuum chamber, or ex-situ performed in a different vacuum chamber than the epitaxy chamber. When in a different vacuum chamber, the etching chamber, in which the etch-back process is performed, may be in a same production tool as the epitaxy chamber, in which the epitaxy process is performed. When transferring wafer 10 between the epitaxy chamber and the etching chamber, there may not be vacuum break.

In the etch-back process, wafer 10 is placed on, and is secured on, susceptor (E-Chuck) 33', which may be the same susceptor or a different susceptor than the susceptor 33 (FIG. 3), depending on whether the etch-back process is performed in the same vacuum chamber as the epitaxy process or not. In accordance with some embodiments, susceptor 33' is configured to be rotated during etch-back process 34. Heat source 36' may be provided, and is used to heat wafer 10 globally during the etch-back process. Heat source 36' may also be the same heat source or different heat source than heat source 36 (FIG. 3), depending on whether the etch-back process is performed in the same vacuum chamber as the epitaxy process or not. In accordance with some embodiments, heat source 36' projects visible light or a light having broad spectrum ranging from infrared to UV. Heat source 36' may be located outside or inside the corresponding vacuum chamber (shown as vacuum chamber 76 in FIG. 9).

During the etch-back process, one or a plurality of laser projectors 40 are used to generate laser beams, and to heat wafer 10 locally, which means that at a time, the laser projector(s) 40 heat a portion or some portions, but not all of the top surface areas of wafer 10. Laser projector(s) 40 are configured to generate laser beam(s) 42, and are alternatively referred to as laser generators. The corresponding etching process 34 is referred to as a laser-assisted etching process hereinafter. The details of the laser projectors 40 and the using of laser projectors 40 are discussed in detail in subsequent paragraphs.

In accordance with some embodiments, during the etch-back process, the wafer temperature affects the etching rate, and the higher the wafer temperature is, the higher the etching rate is. In accordance with some embodiments, wafer 10 may be heated to temperatures in the range between about 400° C. and about 700° C. The temperatures may also be in the range between about 500° C. and about 600° C. The etching gas may be selected from HCl, $Cl_2$, $GeH_xCl_{4-x}$, $SiH_xCl_{4-x}$, or combinations thereof. The pressure in the etching chamber may be in the range between about 1 torr and about 200 torr, and may be in the range between about 1 torr and about 50 torr. The flow rate of the etching gas may be in the range between about 10 sccm and about 1,000 sccm, and may be in the range between about 10 sccm and about 200 sccm. Carrier gas(es) such as hydrogen ($H_2$) and/or nitrogen ($N_2$) may be used. The flow rate of the carrier gas may be in the range between about 5,000 sccm and about 75,000 sccm, and may be in the range between about 40,000 sccm and about 50,000 sccm.

Figure 8:
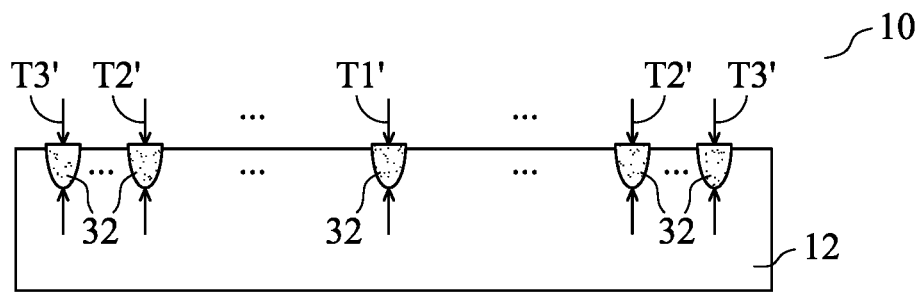
FIG. 8 illustrates a cross-sectional view of a wafer with improved uniformity in the thicknesses of semiconductor regions in accordance with some embodiments.

The etch-back process may achieve a substantially wafer-level uniformity in the thicknesses of semiconductor regions 32. For example, FIG. 8 illustrates that after the etch-back process, the resulting semiconductor region 32 have thicknesses T1', T2', and T3', which are more uniform than thicknesses T1, T2, and T3 as shown in FIG. 7. Through the etch-back processes, the absolute values of the differences in the thicknesses of semiconductor regions 32 are reduced. For example, the absolute thickness difference |T1'−T2'| is smaller than the absolute thickness difference |T1−T2|. Also, the relationship |T2'−T3'|<|T2−T3| and the relationship |T1'−T3'|<|T1−T3| may be obtained through the etch-back process.

The wafer-level uniformity in the thicknesses of semiconductor regions 32 is achieved by heating wafer 10 locally using laser projectors 40. For example, assuming a first semiconductor region 32 is thicker than a second semiconductor region 32, in the etch-back process, the first semiconductor region 32 is etched more than the second semiconductor region 32. This may be achieved by elevating the first semiconductor region 32 to a temperature higher than the temperature of the second semiconductor region 32 using laser projector 40. With the first semiconductor region 32 having the higher temperature, the etching rate of the first semiconductor region 32 is increased higher than the second semiconductor region 32. Since the heating of wafer 10 using the projector(s) 40 is performed locally, it is possible to adjust the temperatures of selected parts of wafer 10 to selected temperatures, and the etching rates are also adjusted locally to achieve wafer-level uniformity.

To achieve the wafer-level uniformity in the thickness of semiconductor regions 32, experiments may be performed to determine the thickness non-uniformity in the wafer, and determine the corresponding temperatures in different parts of the wafer. For example, a sample wafer may be formed, and semiconductor regions 32 are formed in the sample wafer. The thicknesses of semiconductor regions 32 in different parts of the sample wafer are then measured, and the wafer-level non-uniformity is determined. Accordingly, the thickness reduction values of different parts of the sample wafer are calculated. Also, a correlation between the wafer temperature and the etching rates of semiconductor regions 32 is established. The thickness reduction values and the correlation are then used to calculate the local temperatures (and temperature difference) to be used in different parts of the wafer during the etching.

In addition, the parameters of the laser local heating, such as the laser beam size, the incident angles, the traveling speed of the laser beams, the number of laser projectors used, and the like, are also determined based on the requirement of the local heating. The parameters of the laser local heating are discussed in detail in subsequent paragraphs. The non-uniformity data collected from the sample wafer may then be used on the mass-production wafers, so that the wafer-level uniformity may be achieved for the mass production wafers.

In above-discussed embodiments, the epitaxy regions are etched using laser-assisted etching process. In accordance with alternative embodiments, the laser-assisted etching process and the etching apparatus may be used for etching other features and material other than semiconductor regions 32. For example, the etched materials may include, and are not limited to, crystalline silicon, polysilicon, amorphous silicon, crystalline silicon germanium, polycrystalline silicon germanium, amorphous silicon germanium, III-V compound semiconductors, and/or the like. The etched regions may be doped with an n-type dopant, a p-type dopant, or may be undoped.

Figure 5:
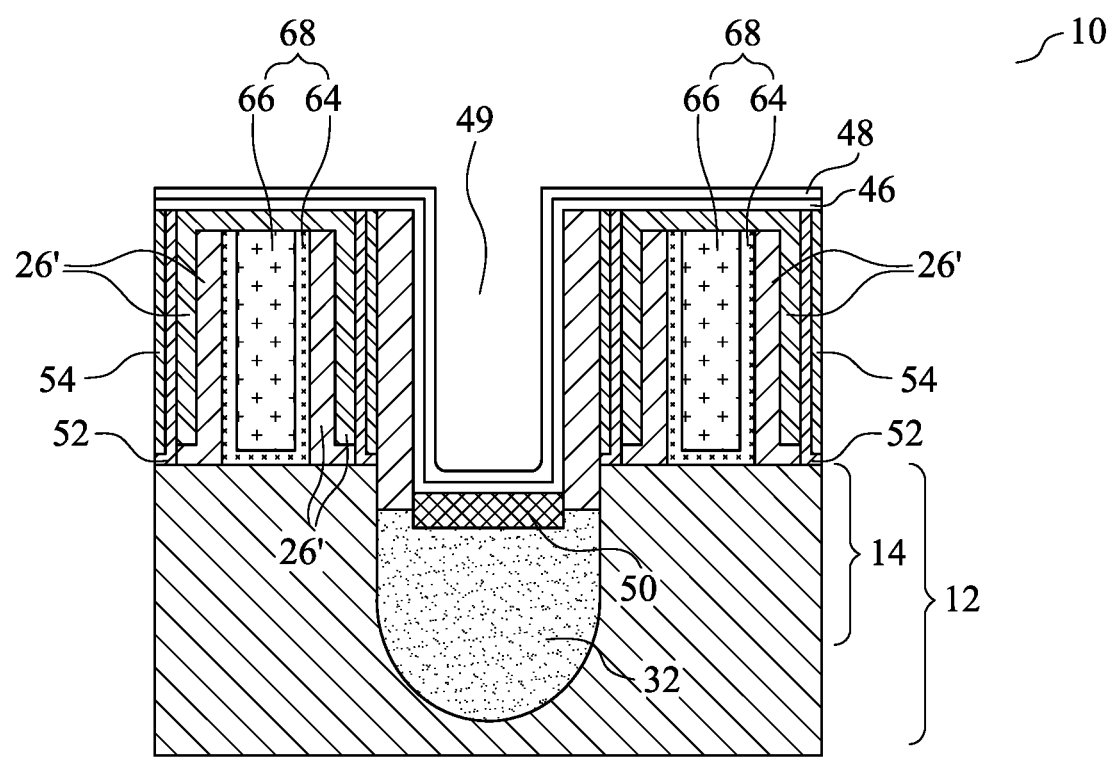

FIG. 5 illustrates the formation of Contact Etch Stop Layer (CESL) 52 and Inter-Layer Dielectric (ILD) 54. The respective process is illustrated as process 214 in the process flow 200 shown in FIG. 19. In accordance with some embodiments of the present disclosure, CESL 52 is formed of or comprises silicon nitride, silicon carbo-nitride, or the like. CESL 52 may be formed through a conformal deposition process such as ALD or CVD, for example. ILD 54 is formed over CESL 52, and may be formed using, for example, FCVD, spin-on coating, CVD, or the like. ILD 54 may be formed of Phospho-Silicate Glass (PSG), Boro-Silicate Glass (BSG), Boron-Doped Phospho-Silicate Glass (BPSG), silicon oxide, or the like. A planarization process such as a Chemical Mechanical Polish (CMP) process or a mechanical grinding process may be performed to level the top surfaces of CESL 52, ILD 54, dummy gate stacks 16, and gate spacers 26' with each other.

Figure 6:
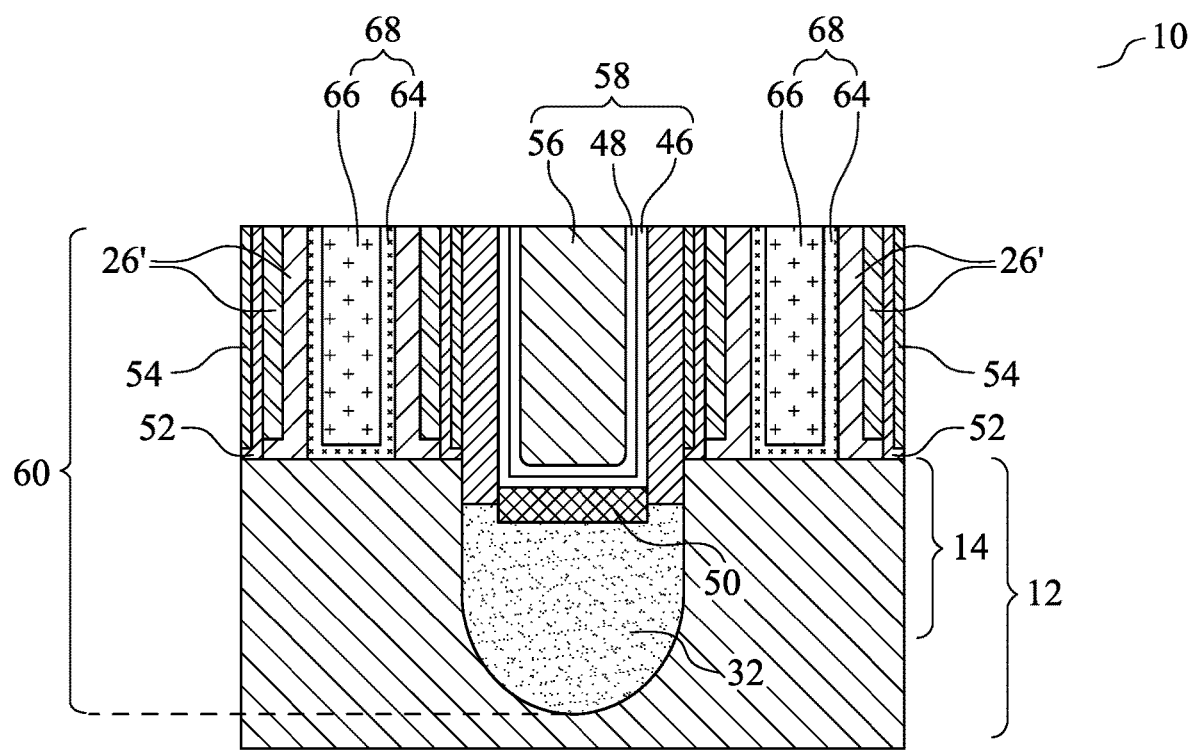

As also shown in FIG. 5, replacement gate stacks 68 are formed. It is appreciated that replacement gate stacks 68 may be formed before (as shown in FIG. 5) or after the formation of the source/drain contact plug 58, as shown in FIG. 6. Replacement gate stacks 68 may include gate dielectrics 64 and gate electrodes 66.

CESL 52 and ILD 54 are etched to form contact opening 49. The respective process is illustrated as process 216 in the process flow 200 shown in FIG. 19. FIG. 5 further illustrates the formation of silicide region 50. The respective process is illustrated as process 218 in the process flow 200 shown in FIG. 19. In accordance with some embodiments, metal layer 46 (such as a titanium layer or a cobalt layer) is deposited, for example, using Physical Vapor Deposition (PVD). Capping layer 48, which may be a metal nitride layer such as a titanium nitride layer or a tantalum nitride layer, is then deposited over metal layer 46. Metal layer 46 and capping layer 48 may both be conformal, and extend into contact opening 49. An annealing process is then performed to react metal layer 46 with the silicon (and germanium, if any) in semiconductor region 32. Source/drain silicide region 50 is thus formed.

FIG. 6 illustrates the formation of contact plug 58. The respective process is illustrated as process 220 in the process flow 200 shown in FIG. 19. In accordance with some embodiments, a metallic material is deposited over and in contact with capping layer 48, which is electrically conductive. The metallic material may include tungsten, cobalt, or the like. A planarization process such as a CMP process or a mechanical grinding process is then performed to remove excess portions of capping layer 48 and the metallic material. The remaining portions of the metallic material is referred to as metal region 56. Metal region 56 and the remaining portions of the metal layer 46 and capping layer 48 collectively form source/drain contact plug 58. Transistor 60 is thus formed.

Figure 9:
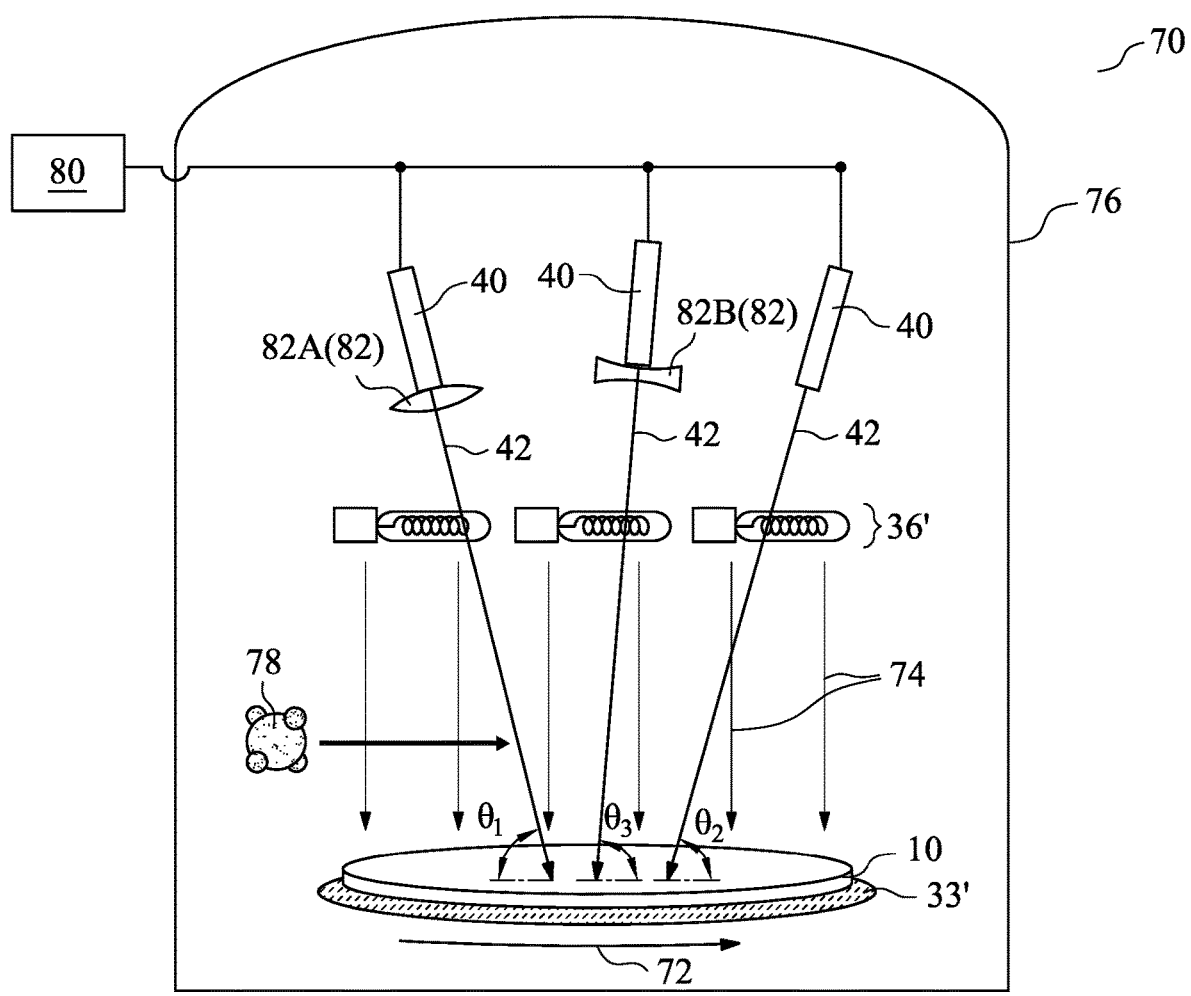
FIG. 9 illustrates an apparatus for a laser-assisted etch-back process in accordance with some embodiments.

Referring to FIG. 9, production tool 70, which includes a vacuum chamber 76 that is used for the etching (as shown in FIG. 4) of semiconductor regions 32, is shown. Vacuum chamber 76 may or may not be used for the epitaxy process. Wafer 10 is placed on, and is secured on, susceptor 33'. In accordance with some embodiments, susceptor 33' is configured to be rotated, as shown by arrow 72. Process gases 78, which may include the etching gas such as HCl, $Cl_2$, or the like, and the carrier gas(es) are provided to wafer 10.

Heat sources 36' are provided, and are configured to project light 74 on wafer 10 in order to heat wafer 10 globally. Heat source 36' may be located outside or inside vacuum chamber 76. There may be, or may not be, heat sources under wafer 10. Heat sources 36' are configured to provide uniform heating to wafer 10 as much as possible, so that different parts of wafer 10 are heated to the same temperature as much as possible, which may be in the range between about 400° C. and about 700° C. The temperatures may also be in the range between about 500° C. and about 600° C.

At least one laser projector 40 or a plurality of laser projectors 40 are used for the laser-assisted etch-back process. In accordance with some embodiments, laser projectors 40 are located inside vacuum chamber 76, as shown in FIG. 9. In accordance with alternative embodiments, one or all of laser projectors 40 are located outside vacuum chamber 76. In accordance with these embodiments, at least a top part (which part may have a transparent window) of the chamber wall of vacuum chamber 76 is transparent for laser beams 42 to pass through. The transparent chamber wall may be formed of or comprises quartz, silicon oxide, a ceramic, a glass, or the like.

Laser projectors 40 are configured to generate laser beams 42, and project laser beams 42 on wafer 10, so that the temperatures of the projected areas of wafer 10 are increased. The laser beams 42 are projected on the regions where the thickness of semiconductor regions 32 are to be etched back more than other regions. The laser beams 42 may also be directed to wafer regions where temperatures are lower than in other wafer region, so that the temperature non-uniformity caused by heating sources 36' may be corrected.

Laser projectors 40 may be of various types, and the resulting laser beams 42 may be selected from a plurality of different types. For example, the generated laser may be gas laser (e.g. helium-neon laser), excimer laser (such as KrF laser (with wavelength being about 248 nm)), XeCl laser (with wavelength being about 308 nm), XeF laser (with wavelength being about 351 nm), solid-state laser, semiconductor diode laser, or other lasers.

In accordance with some embodiments, there is a single laser projector 40. In accordance with alternative embodiments, there are a plurality of (such as 2, 3, 4, 5, or more) laser projectors 40 used. In the subsequent discussion, a plurality of laser projectors 40 are discussed as an example, while the discussed embodiments may also be applied to the single laser projector 40, whenever applicable. The laser beams 42 generated by different laser projectors 40 may be identical to each other or may be different from each other, for example, with the same or different wavelengths, spot sizes, power density values, etc.

Laser projectors 40 are electrically and signally connected to control unit 80, which is configured to control the operation of each of laser projectors 40. The corresponding operations are discussed subsequently. For example, control unit 80 is configured to tilt the angle of laser projector 40, so the laser beams 42 travels on wafer 10. Control unit 80 may also adjust the output power of laser beams 42 based on the non-uniformity data as obtained from the sample wafer. For example, when laser beams 42 travel to certain parts of wafer 10 that need to be etched more, control unit 80 increases the output power of the corresponding laser projector. Conversely, when laser beams 42 travels to other parts of wafer that need to be etched less, control unit 80 reduces or shuts down the output power of the corresponding laser projector 40. Control unit 80 may control the operations of laser projectors 40 independent from each other. For example, when the output power of a laser projector 40 is reduced, the output power of another laser projector 40 may be increased. The traveling directions, speed, etc. of the plurality of laser beams 42 may also be controlled independently. Control unit 80 may also control a motor that rotates wafer 10, so that the rotation speed of wafer 10 is adjusted. The control of laser beams 42 may be synchronized with the adjustment of wafer rotation.

In accordance with some embodiments, some of all of laser projectors 40 may have optical devices 82 (including optical devices 82A and 82B as examples) for adjusting the sizes of the corresponding laser beams 42. For example, optical device 82A may include a convex lens (and additional convex and concave lenses), and may be used to reduce the corresponding laser beam size. Optical device 82B may include a concave lens (and additional convex and concave lenses), and may be used to increase the corresponding laser beam size. There may be (or may not be) some laser projectors 40 not attached with any optical device, as shown in FIG. 9.

Figure 10:
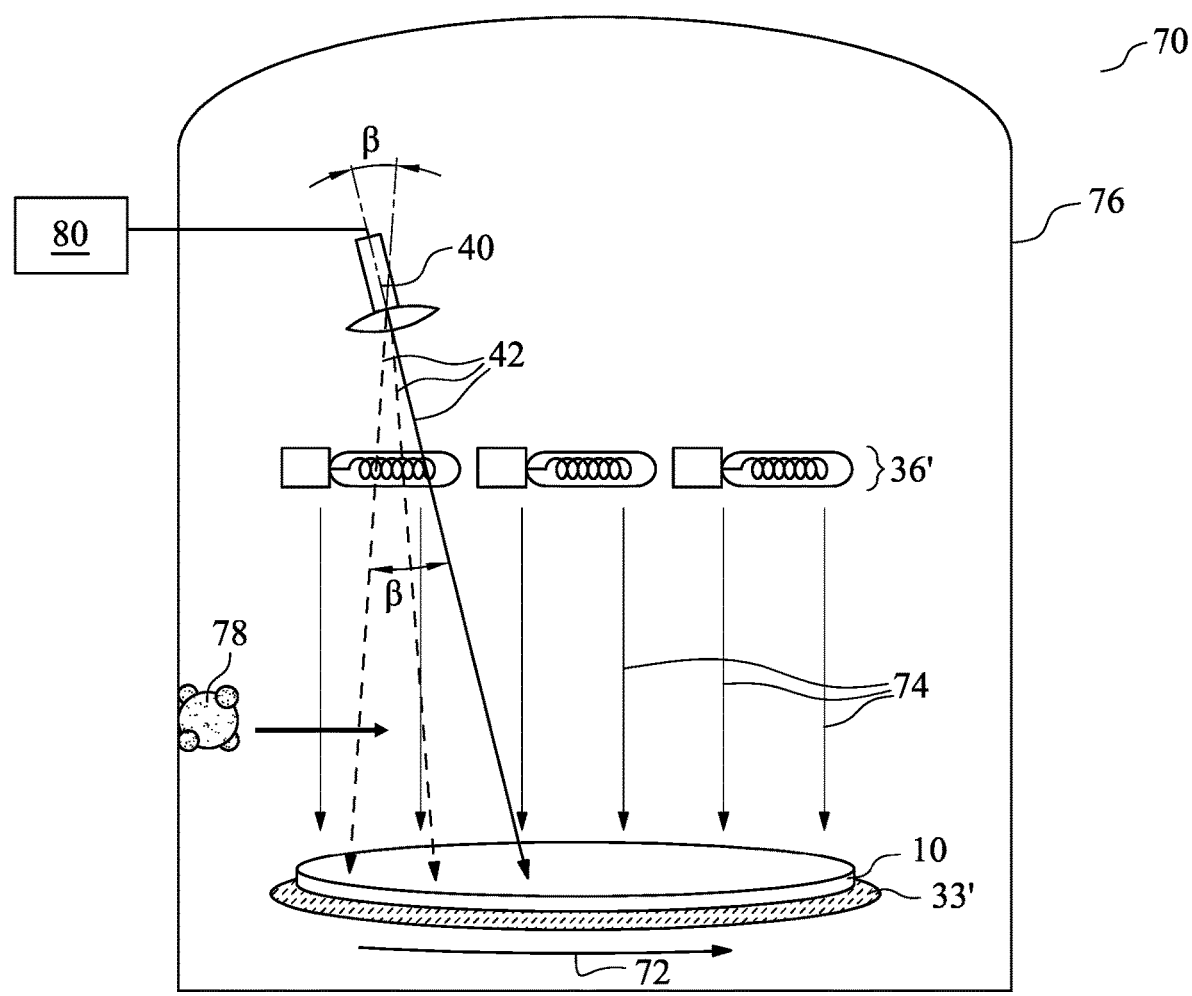
FIG. 10 illustrates the tilting of a laser projector in accordance with some embodiments.

FIG. 10 illustrates an example as how laser beam 42 may travel on wafer 10. The corresponding laser projector 40 may be tilted, for example, with a tilting angle range β. This also causes the corresponding laser beam 42 to tilt for tilting angle range β. Tilting angle range β is selected so that the corresponding laser beam 42 is able to travel between the center and an edge of wafer 10, or may be able to travel from one edge to the opposite edge on the same diameter of wafer 10. In accordance with some embodiments, tilting angle range β may be smaller than about 45 degrees. The traveling path of a laser beam 42 may be along a diameter of wafer 10, or may be misaligned from any diameter of wafer 10.

Figure 11:
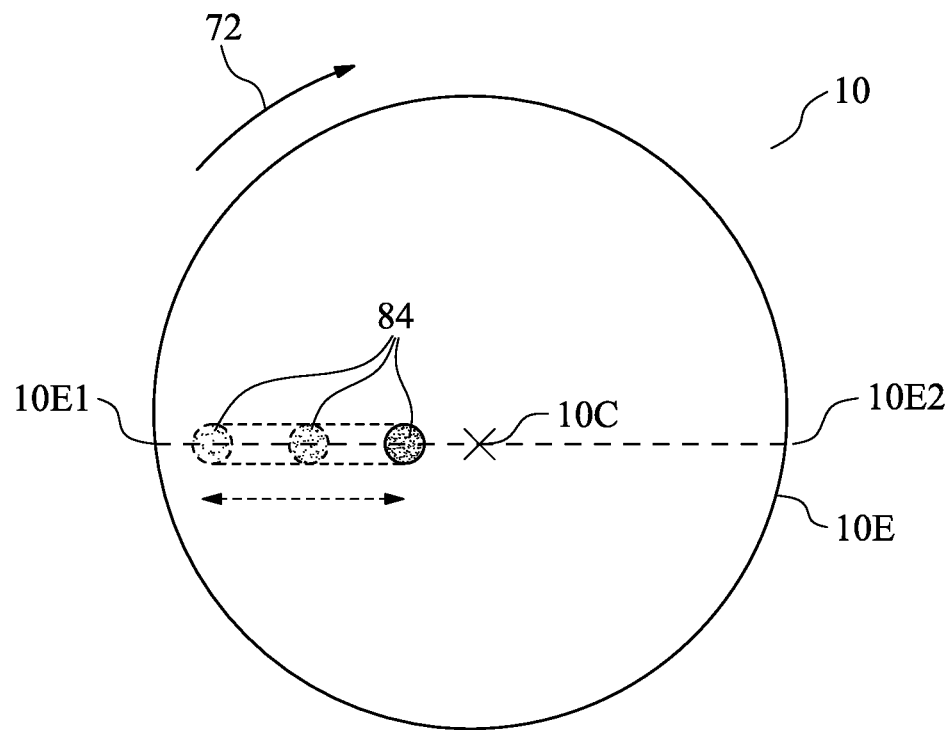
FIG. 11 illustrates a top view of a wafer having a laser beam spot on the wafer in accordance with some embodiments.

FIG. 11 illustrates a top view of wafer 10, which has center 10C and edge 10E, with edge 10E being circular. Wafer 10 is rotated with respect to center 10C during the etch-back process. Wafer 10 may be rotated at a speed in the range between about 1 round per minute and about 60 rounds per minute. Laser beam spot 84, which is the landing area of the laser beam 42 (FIG. 9) on wafer 10, is illustrated. With the traveling of laser beam 42, the laser beam spot 84 is able to be projected on, and covers, any selected region on wafer 10. Laser beam spot 84 may travel back-and-forth in a selected range on wafer 10. For example, FIG. 11 illustrates an example travel range. The travel range may also expand from center 10C to edge 10E, or from edge 10E1 to opposing edge 10E2.

The power density of laser beam 42 cannot be too high or too low. If the power density is too high, the control of the temperature-rise is difficult. If the power density is too low, it takes too long to heat a region to a desirable temperature, and the laser beams may not be able to cover all of the desirable parts of the wafer in time. The power density of the laser beam 42 may be in the range between about 1 mW/mm$^2$ and about 50,000 mW/mm$^2$, and may be in the range between about 100 mW/mm$^2$ and about 1,000 mW/mm$^2$. The laser power may be fixed or may be tuneable. For example, for solid state lasers or semiconductor diode laser, the power may be tuned by adjusting the input driving current of laser projectors 40. The received power density of laser beam spot 84 (FIG. 11) may be the same as or slightly lower than the output power density of laser beam 42.

The power intensity of some or all of the laser beams 42 can be kept constant during the etching process, or can be dynamically altered over time. For example, the laser power density may be tuned to about 100 mW/mm$^2$ for 1 second, followed by about 200 mW/mm$^2$ for 1 second. The adjusting of the power density of the laser beams may also be combined with the movement and the adjustment of the incident angles of laser projectors 40 to achieve more fine-tuned adjustment of power. For example, in the movement of a laser beam spot, when the laser beam spot passes through the wafer regions that need more thickness reduction, the laser power may be increased. Conversely, when the laser beam spot passes through the wafer areas that need less thickness reduction, the laser power may be reduced. When the laser beam spot passes through the wafer regions that need the least reduction, the laser power may be turned off. Furthermore, when the laser beam 42 travels on a path in one direction (for example, from edge 10E1 to edge 10E2), the laser beam 42 may be turned on and off for multiple cycles, and the power density may also be adjusted for multiple cycles. This may achieve different heating temperatures for multiple parts (such as multiple ring-zones) on wafer 10.

Figure 12:
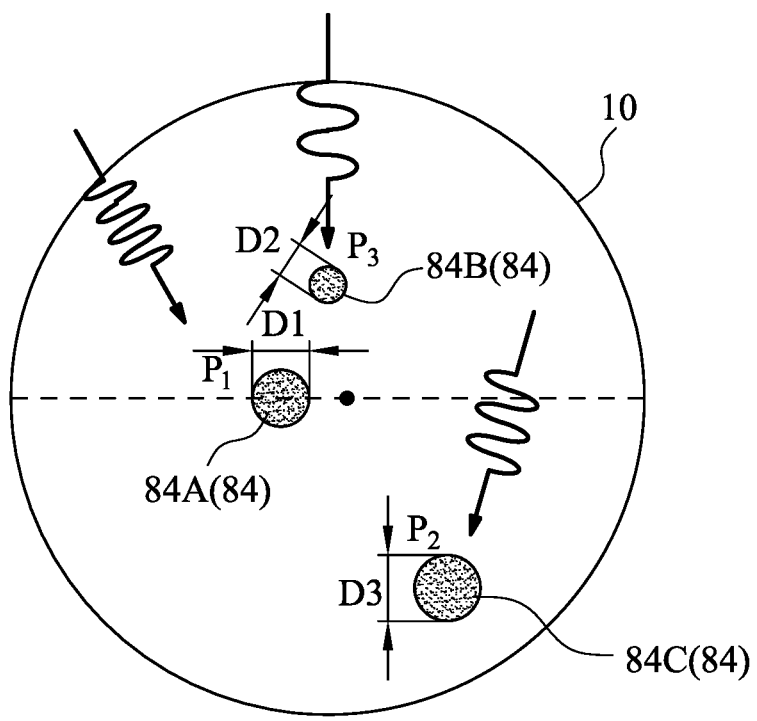
FIG. 12 illustrates a top view of a wafer having a plurality of laser beam spots with different sizes in accordance with some embodiments.

FIG. 12 illustrates a top view of wafer 10, wherein a plurality of laser beam spots 84 (including 84A, 84B, and 84C) are illustrated. The spot sizes of laser beams 42 partially determine the power density values such as P1, P2, and P3, which affect the desirable temperature change caused by laser beams. The spot sizes also affect the intended temperature ramp-up rate (the temperature change in a unit time, with unit of ° C./minute, for example). The smaller the spot size is, the higher and faster temperature ramp-up will be obtained. Also, a smaller spot size enables a more precise and more selective heating in a more localized region, while a greater spot size may allow larger areas to be covered. The spot sizes D1, D2, and D3 may be in the range between about 1 mm and about 50 mm, and may be in the range between about 5 mm and about 10 mm. Spot sizes D1, D2, and D3 may be the same as or may be different from each other, which spot sizes may be adjusted using optical devices when needed.

The wavelength of laser beam 42 is related to the power density, and the smaller the wavelength is, the higher power density may be obtained. In accordance with some embodiments, the wavelengths of the laser beams 42 may be in the range between about 400 nm and about 1,400 nm, and may be in the range between about 800 nm and about 1,100 nm. The wavelengths of the different laser beams 42 may be selected independently, and may be the same as each other or different from each other.

Referring back to FIG. 9, the incident angles (including θ1, θ2, and θ3) of laser beams 42 may also affect the power density received by wafer 10, and the smaller the incident angle is, the lower power density is received by wafer 10. In accordance with some embodiments, the incident angles of the laser beams 42 may be in the range between about 45 degrees and about 90 degrees, and may be in the range between about 75 degrees and about 90 degrees. The incident angles of different laser beams may also be controlled independently, and may be the same as each other or different from each other.

Figure 13:
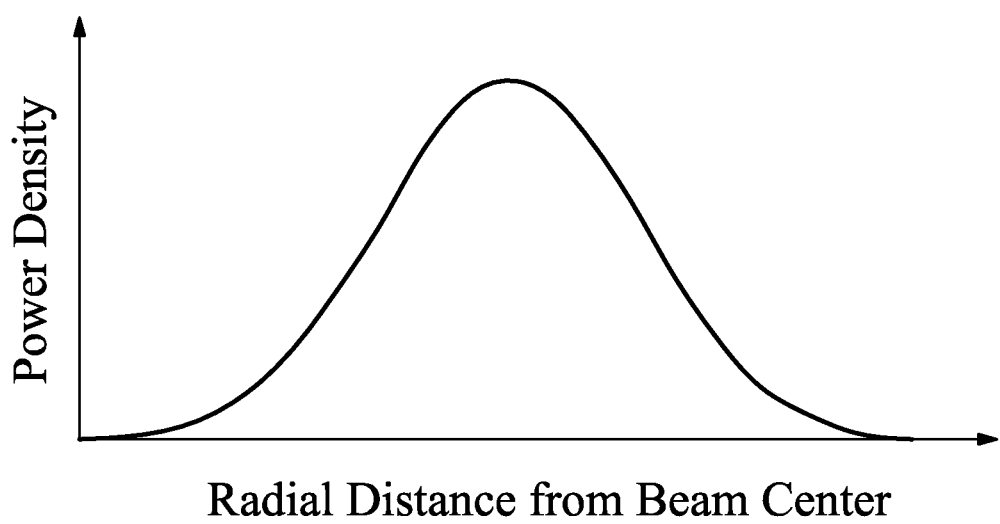
FIG. 13 illustrates the energy distribution in a laser beam in accordance with some embodiments.

FIG. 13 illustrates a power density distribution in a laser beam as a function of the distance from the center of the laser beam. It is observed that at the beam center, the power density may be at a peak value, and farther from the beam center, the power density is reduced. Accordingly, the corresponding temperature ramp-up caused by the laser beam also has a similar distribution.

Figure 14:
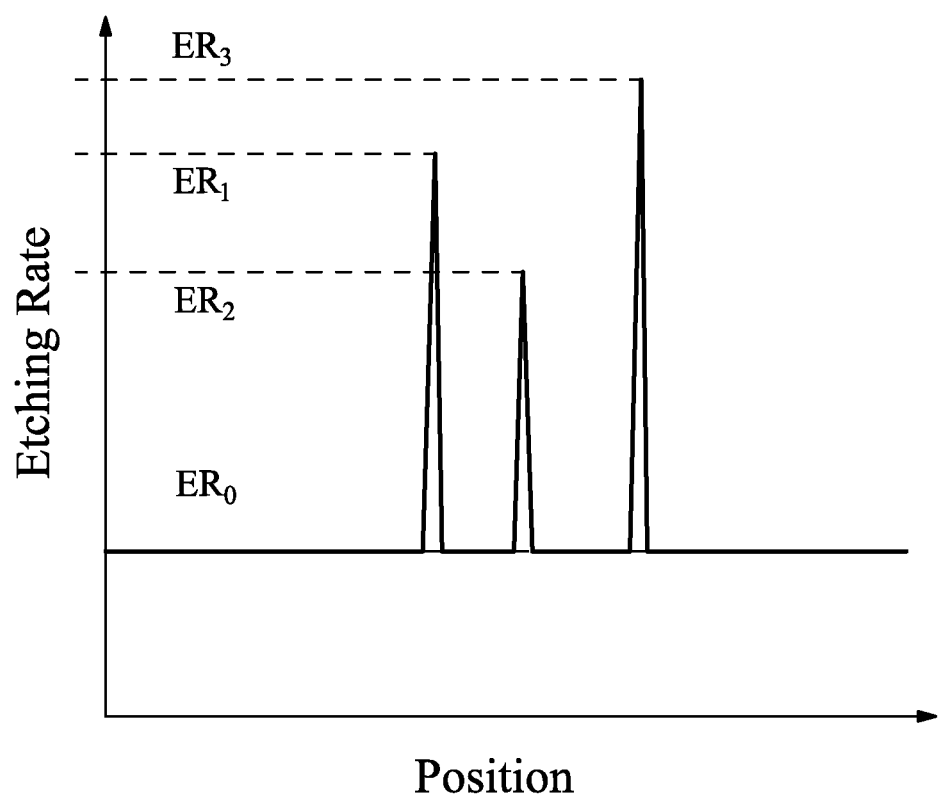
FIG. 14 illustrates the etching rates of semiconductor regions in accordance with some embodiments.

FIG. 14 illustrates the etching rates of the etched semiconductor regions affected by the laser beams, wherein an etching rate is the reduction in the thickness (per unit time) of the etched region. FIG. 14 illustrates the etching rates of the wafer regions on which three laser beams are projected as examples. Etching rate ER0 represents the etching rate of the parts of the etched semiconductor regions subject to global heating, and not subject to local heating. It is shown that in the parts of the wafer where the laser beams are projected, the etching rates may significantly spike up. For example, the etching rate ratios ER1/ER0, ER2/ER0, and ER3/ER0 are greater than 1.0, and may be in the range between 1 and about 10, or in the range between about 1.5 and about 5. The corresponding temperature-increase in the parts of wafer 10 heated by laser beams may be in the range between about 20° C. and about 150° C.

Figure 15:
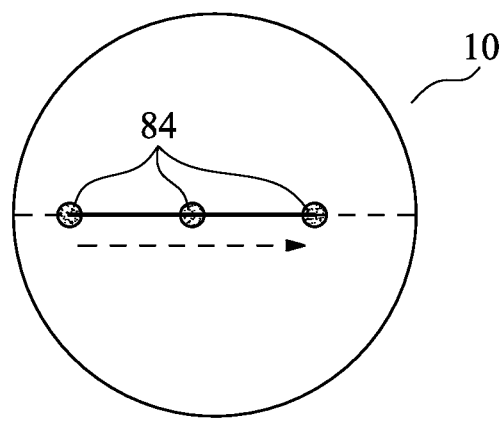
FIGS. 15-18 illustrate some laser beam traveling patterns on wafers in accordance with some embodiments.

FIGS. 15 through 18 illustrate some patterns of laser beam spots on wafer 10 in accordance with some embodiments. In FIG. 15, wafer 10 is stationary and is not rotated. Laser beam spot 84 may move to any selected region on wafer 10, and may perform spot-by-spot heating. For example, FIG. 15 illustrates wafer 10 heats a straight path in accordance with some embodiments. The spot heating may also be performed on random spots on wafer 10, based on the etching rate requirement of the local regions of wafer 10.

Figure 16:
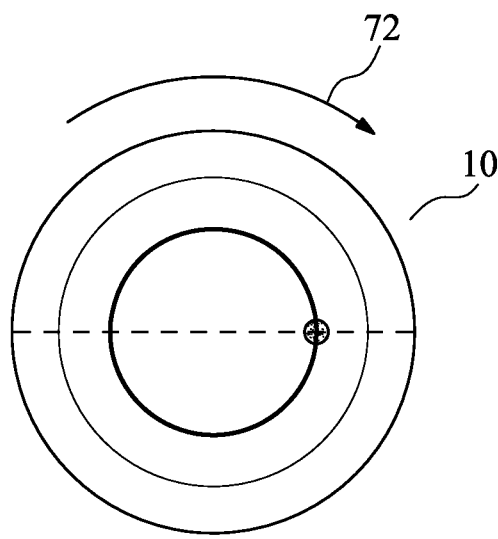

FIG. 16 illustrates an embodiment in which wafer 10 is rotated, while laser projector 40 is fixed in tilting angle. Accordingly, the laser beam spot 84 will scan along a circle when laser projector 40 is fixed to one position. When laser projector 40 is moved to a second position and fixed at the second position, laser beam spot 84 will scan along another circle. With the laser beam spots moved to multiple positions, a plurality of concentric laser scan paths are generated.

Figure 17:
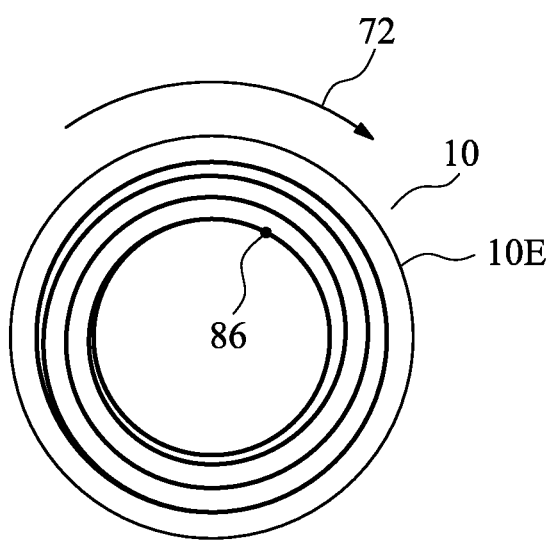

FIG. 17 illustrates an embodiment in which wafer 10 is rotated, and laser projector 40 also moved simultaneously. For example, initially, wafer 10 is rotated, and the laser beam spot is at the position 86. Accordingly, the scan path includes a circle. The laser beam spot then moves toward the edge of wafer 10. Accordingly, the scan path further includes a spiral pattern.

Figure 18:
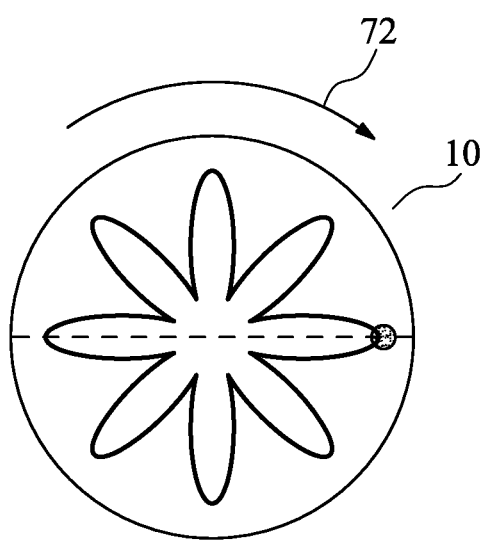

FIG. 18 illustrates an embodiment in which wafer 10 is rotated, and the laser beam spot is also moved simultaneously. These embodiments are similar to the embodiments shown in FIG. 17, except that in FIG. 17, the laser beam spot travels slowly, and when laser beam spot travels from position 86 to the edge 10E, wafer 10 has been rotated for at least one round or multiple rounds. In FIG. 18, however, the laser beam spot travels fast, and when wafer 10 is rotated for one round, the laser beam spot has traveled back-and-forth for multiple rounds (such as 8 rounds in FIG. 18).

The pattern selection, such as shown in FIGS. 15 through 18, may be affected by the desirable change in temperature and temperature ramp-up rate. It may take about 10 milliseconds for a target area exposed to laser beam to reach a stable temperature, while after 5 milliseconds, the temperature is mostly stabled. Extra time is also needed to ramp-up (before stabilizing) temperature, and higher temperature may desire longer time (while other factors such as power density also affects the required ramp-up time). Accordingly, the dwell time (the period of time a target area is exposed to a laser beam) can be selected to be at least 5 milliseconds, and may be in the range between about 5 milliseconds and about 500 milliseconds, and may be in the range between about 5 milliseconds and about 100 milliseconds.

In accordance with some embodiments, the local heating process, such as which parts of the wafers are to be heated, the desirable amount of temperature increase, and the like is determined prior to the etch-back process. In accordance with alternative embodiments, the determination is made dynamically. For example, the desirable temperatures on the local regions of wafer 10 may be determined from a sample wafer. During the etch-back process, the temperatures of the local regions being heated by the laser beams are measured in real-time, for example, using one or more pyrometers. The measured temperatures can be fed back to control unit 80 (FIG. 9), which adjusts the power, intensity, moving speed, moving range, etc. of the laser beams 42 to ensure that the local temperatures (and local etching rates) are as desirable.

It is appreciated that although laser is used as a heating source for locally heating wafer, alternative local heating sources that can locally heat wafers can also be adopted. For example, focused UV light beams with limited size, for example, smaller than about 50 mm, may also be used. The embodiments of the laser projectors as discussed referring to FIGS. 9 through 18 may also be applied when the alternative local heating sources are used.

Although the etching of epitaxy semiconductor regions is used as an example to present the concept of the present disclosure, the concept of the present disclosure may be applied to the etching of other features and materials including, and not limited to, dielectric materials, metals, or the like. For example, before the formation of dummy gates as shown in FIG. 1, a blanket semiconductor layer may be epitaxially grown on semiconductor substrate 12. The blanket semiconductor layer may be a fully strained silicon germanium layer, a fully strained germanium layer, or the like. The blanket semiconductor layer may have non-uniformity in the thicknesses, which non-uniformity may also be reduced by adopting the laser-assisted etch-back process in accordance with some embodiments.

The embodiments of the present disclosure have some advantageous features. By locally heating wafers in a controllable manner, the etching rates in local regions of the wafer may be increased to desirable values. This may be used to reduce the non-uniformity in the etched materials.

In accordance with some embodiments of the present disclosure, a method comprises forming a plurality of semiconductor regions on a wafer; placing the wafer in an etching chamber; globally heating the wafer using a heating source; projecting a first laser beam on the wafer; and when the wafer is heated by both of the heating source and the first laser beam, etching the plurality of semiconductor regions on the wafer. In an embodiment, the method further comprises, when the semiconductor regions are etched, projecting a second laser beam on the wafer. In an embodiment, laser beam spots of the first laser beam and the second laser beam have different sizes.

In an embodiment, the first laser beam and the second laser beam have different power density values. In an embodiment, the first laser beam and the second laser beam have different wavelengths. In an embodiment, during the etching, the wafer is rotated. In an embodiment, during the etching, the first laser beam travels between a center and an edge of the wafer. In an embodiment, the method further comprises fixing the first laser beam to a first position at a first distance from a center of the wafer, and rotating the wafer for at least one round; and moving the first laser beam to a second position at a second distance from the center, and rotating the wafer for at least one round. In an embodiment, the first laser beam is generated by a laser beam generator, and the method further comprises inserting an optical device between the laser beam generator and the wafer to adjust a size of the first laser beam. In an embodiment, the size of the first laser beam is increased using the optical device.

In accordance with some embodiments of the present disclosure, a method comprises globally heating a wafer; locally heating a first portion of the wafer using a first light beam generated by a first localized radiation source, wherein the first light beam has a first size smaller than a second size of the wafer; and at a time when the wafer is heated both globally and locally, etching the wafer. In an embodiment, the first portion of the wafer has a first temperature when heated by the first light beam, and a second portion of the wafer not heated by the first light beam has a second temperature lower than the first temperature.

In an embodiment, the first portion of the wafer has a first etching rate when heated by the first light beam, and a second portion of the wafer away from the first portion and not heated by the first light beam has a second etching rate lower than the first etching rate. In an embodiment, the first localized radiation source comprises a laser beam generator. In an embodiment, the first localized radiation source comprises an ultra-violate beam generator. In an embodiment, the method further comprises locally heating a second portion of the wafer using a second light beam generated by a second localized radiation source, wherein the first light beam and the second light beam are separated from each other.

In accordance with some embodiments of the present disclosure, a method comprises generating a laser beam; using an optical device to adjust a beam size of the laser beam; heating a wafer using the laser beam; rotating the wafer; and when the wafer is heated by the laser beam and is rotated, etching the wafer. In an embodiment, the laser beam generates a laser beam spot on the wafer, and wherein when the wafer is etched and rotated, the laser beam spot travels between a center and an edge of the wafer. In an embodiment, the method further comprises epitaxially growing epitaxy semiconductor regions as top portions of the wafer, wherein the etching the wafer comprises etching the epitaxy semiconductor regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a plurality of semiconductor regions on a wafer;
placing the wafer in an etching chamber;
globally heating the wafer using a heating source;
projecting a first laser beam on the wafer using a first laser projector;
projecting a second laser beam on the wafer using a second laser projector, wherein laser beam spots of the first laser beam and the second laser beam have differences selected from the group consisting of different sizes, different power densities, different wavelengths, and combinations thereof; and
when the wafer is heated by both of the heating source and the first laser beam, etching the plurality of semiconductor regions on the wafer.

2. The method of claim 1, wherein the laser beam spots of the first laser beam and the second laser beam have different sizes.

3. The method of claim 1, wherein the first laser beam and the second laser beam have different power density values.

4. The method of claim 1, wherein the first laser beam and the second laser beam have different wavelengths.

5. The method of claim 1 further comprising, during the etching the plurality of semiconductor regions on the wafer, turning on and off the first laser beam.

6. The method of claim 1, wherein the first laser beam is generated by a laser beam generator, and the method further comprises inserting an optical device between the laser beam generator and the wafer to adjust a size of the first laser beam.

7. The method of claim 6, wherein the size of the first laser beam is increased using the optical device.

8. The method of claim 1, wherein during the etching, the wafer is rotated.

9. The method of claim 8, wherein during the etching, a spot of the first laser beam travels between a center and an edge of the wafer.

10. The method of claim 8 further comprising:
fixing the first laser beam to a first position at a first distance from a center of the wafer, and rotating the wafer for at least one round; and
moving the first laser beam to a second position at a second distance from the center, and rotating the wafer for at least one round.

11. A method comprising:
globally heating a wafer;
locally heating a first portion of the wafer using a first light beam generated by a first localized radiation source, wherein the first light beam has a first size smaller than a second size of the wafer;
locally heating a second portion of the wafer using a second light beam generated by a second localized radiation source, wherein the first light beam and the second light beam are separated from each other; and
at a time when the wafer is heated both globally and locally, etching the wafer.

12. The method of claim 11, wherein the first portion of the wafer has a first etching rate when heated by the first light beam, and a third portion of the wafer away from the first portion and not heated by the first light beam and the second light beam has a second etching rate lower than the first etching rate.

13. The method of claim 11, wherein the first localized radiation source comprises a laser beam generator.

14. The method of claim 11, wherein the first localized radiation source comprises an ultra-violate beam generator.

15. The method of claim 11 further comprising, when the wafer is etched, moving spots of the first light beam and the second light beam separately.

16. The method of claim 11, wherein the first portion of the wafer has a first temperature when heated by the first light beam, and a third portion of the wafer not heated by the first light beam and the second light beam has a second temperature lower than the first temperature.

17. The method of claim 16, wherein a temperature difference between the first temperature and the second temperature is in a range between about 20° C. and about 150° C.

18. A method comprising:
generating a laser beam;
using an optical device to adjust a beam size of the laser beam;
heating a wafer using the laser beam, wherein the laser beam generates a laser beam spot on the wafer;
rotating the wafer; and
when the wafer is heated by the laser beam and is rotated, etching the wafer, wherein when the wafer is etched and rotated, the laser beam spot travels between a center and an edge of the wafer.

19. The method of claim 18 further comprising epitaxially growing epitaxy semiconductor regions as top portions of the wafer, wherein the etching the wafer comprises etching the epitaxy semiconductor regions.

20. The method of claim 18 further comprising, when the laser beam spot travels between the center and the edge of the wafer, adjusting a power density of the laser beam spot.

* * * * *